United States Patent
Chopson et al.

(10) Patent No.: US 11,068,623 B2
(45) Date of Patent: Jul. 20, 2021

(54) AUTOMATED BUILDING DESIGN GUIDANCE SOFTWARE THAT OPTIMIZES COST, ENERGY, DAYLIGHT, GLARE, AND THERMAL COMFORT

(71) Applicants: Patrick Mark Chopson, Atlanta, GA (US); Sandeep Ahuja, Atlanta, GA (US); Daniel Jay Chopson, Atlanta, GA (US)

(72) Inventors: Patrick Mark Chopson, Atlanta, GA (US); Sandeep Ahuja, Atlanta, GA (US); Daniel Jay Chopson, Atlanta, GA (US)

(73) Assignee: COVE TOOL, INC., Atlanta, GA (US)

( * ) Notice: Subject to any disclaimer, the term of this patent is extended or adjusted under 35 U.S.C. 154(b) by 361 days.

(21) Appl. No.: 16/266,595

(22) Filed: Feb. 4, 2019

(65) Prior Publication Data
US 2020/0250280 A1 Aug. 6, 2020

(51) Int. Cl.
*G06F 30/13* (2020.01)
*E04B 1/76* (2006.01)

(52) U.S. Cl.
CPC .............. *G06F 30/13* (2020.01); *E04B 1/762* (2013.01)

(58) Field of Classification Search
CPC .......... G06F 30/13; G06F 30/20; G06F 30/00; E04B 1/762
USPC .......................................................... 703/1
See application file for complete search history.

(56) References Cited

U.S. PATENT DOCUMENTS

| | | | |
|---|---|---|---|
| 5,812,422 A | 9/1998 | Lyons | |
| 5,815,394 A | 9/1998 | Adeli et al. | |
| 8,006,220 B2 | 8/2011 | McConaghy et al. | |
| 9,235,657 B1 | 1/2016 | Wenzel et al. | |
| 2004/0133406 A1* | 7/2004 | Ozeki | G01W 1/17 703/2 |
| 2005/0234600 A1 | 10/2005 | Boucher et al. | |
| 2006/0074608 A1 | 4/2006 | Clay et al. | |
| 2008/0249756 A1* | 10/2008 | Chaisuparasmikul | G06F 30/20 703/13 |
| 2010/0106674 A1* | 4/2010 | McLean | F24F 11/30 706/52 |
| 2011/0153524 A1 | 6/2011 | Schnackel | |
| 2012/0150509 A1 | 6/2012 | Shiel | |

(Continued)

*Primary Examiner* — Cedric Johnson
(74) *Attorney, Agent, or Firm* — Dunlap Bennett & Ludwig, PLLC

(57) ABSTRACT

A method of optimizing computer-implemented building design, includes the following: defining one or more options for each building component; providing an energy use intensity versus cost optimization value for each option for a plurality of metrics; selecting a subset of the plurality of metrics applicable to each option; defining a metric vector for each metric through connecting the energy use intensity versus cost optimization value for each option; arranging each metric vector on a coordinate grid with an equal angle between each metric vector; constructing a two-dimensional polygon on an XY-plane by interconnecting for all the metric vectors the energy use intensity versus cost optimization value for each option; providing a performance value for each option for each metric vector based on a percentage the metric vector the associated option represents; and representing a fitness factor for each option as a function of each of the plurality of metrics.

6 Claims, 4 Drawing Sheets

(56) References Cited

U.S. PATENT DOCUMENTS

| | | | |
|---|---|---|---|
| 2012/0239353 A1* | 9/2012 | Vercruysse | G06F 30/13 |
| | | | 703/1 |
| 2012/0296611 A1 | 11/2012 | Teller et al. | |
| 2013/0073102 A1 | 3/2013 | Bischof et al. | |
| 2013/0124250 A1 | 5/2013 | Crawley et al. | |
| 2013/0144546 A1 | 6/2013 | Brackney et al. | |
| 2014/0288890 A1* | 9/2014 | Khainson | G06F 30/13 |
| | | | 703/1 |
| 2014/0365180 A1 | 12/2014 | Lam et al. | |
| 2015/0234944 A1* | 8/2015 | Marceau | G06F 30/13 |
| | | | 703/1 |
| 2016/0195887 A1 | 7/2016 | Shiel | |
| 2016/0210569 A1 | 7/2016 | Enck | |
| 2016/0370771 A1 | 12/2016 | Torres Fuchslocher et al. | |
| 2018/0025452 A1 | 1/2018 | Fadeev et al. | |
| 2018/0231967 A1 | 8/2018 | Cohen et al. | |
| 2018/0262573 A1 | 9/2018 | Przybylski et al. | |

\* cited by examiner

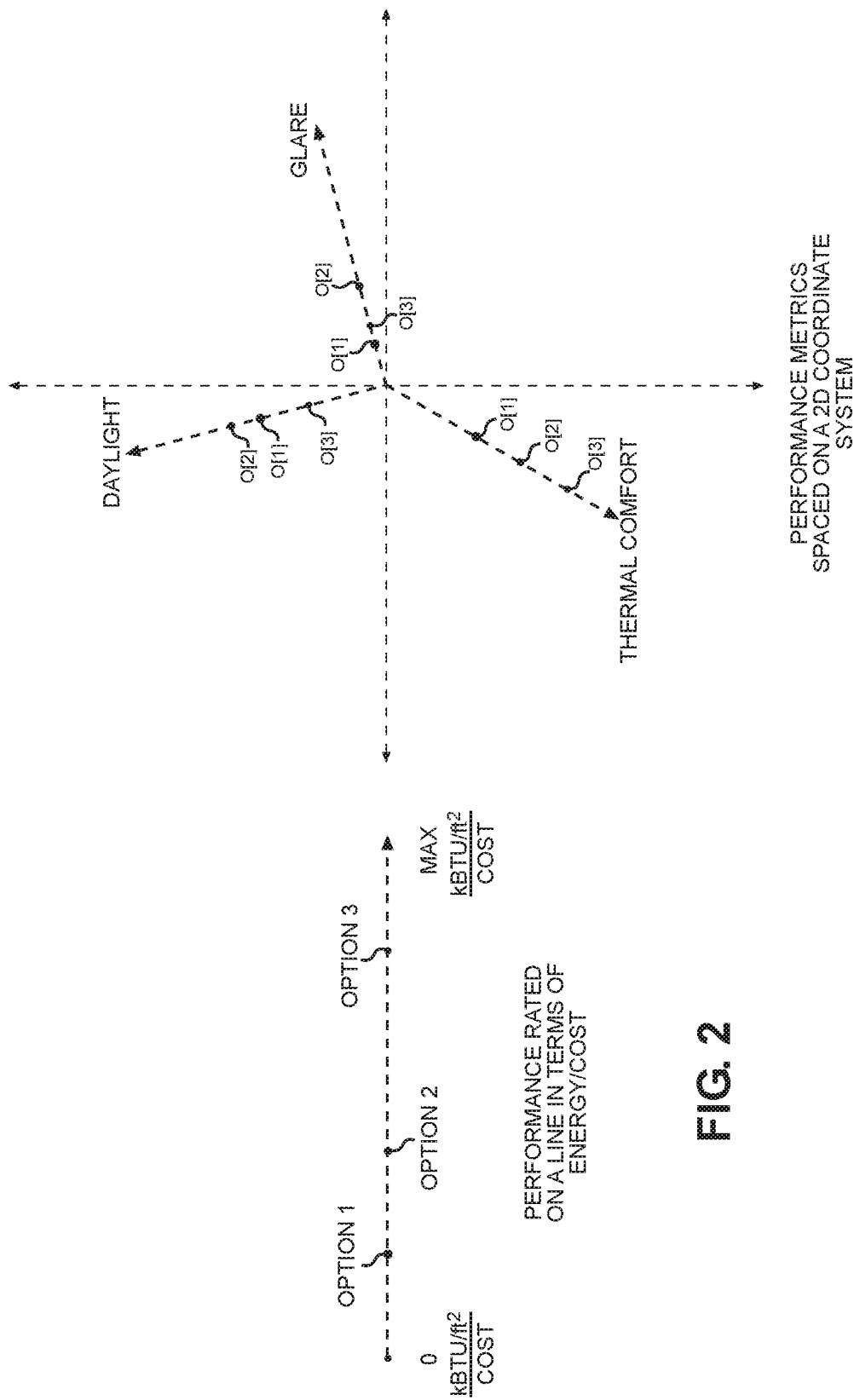

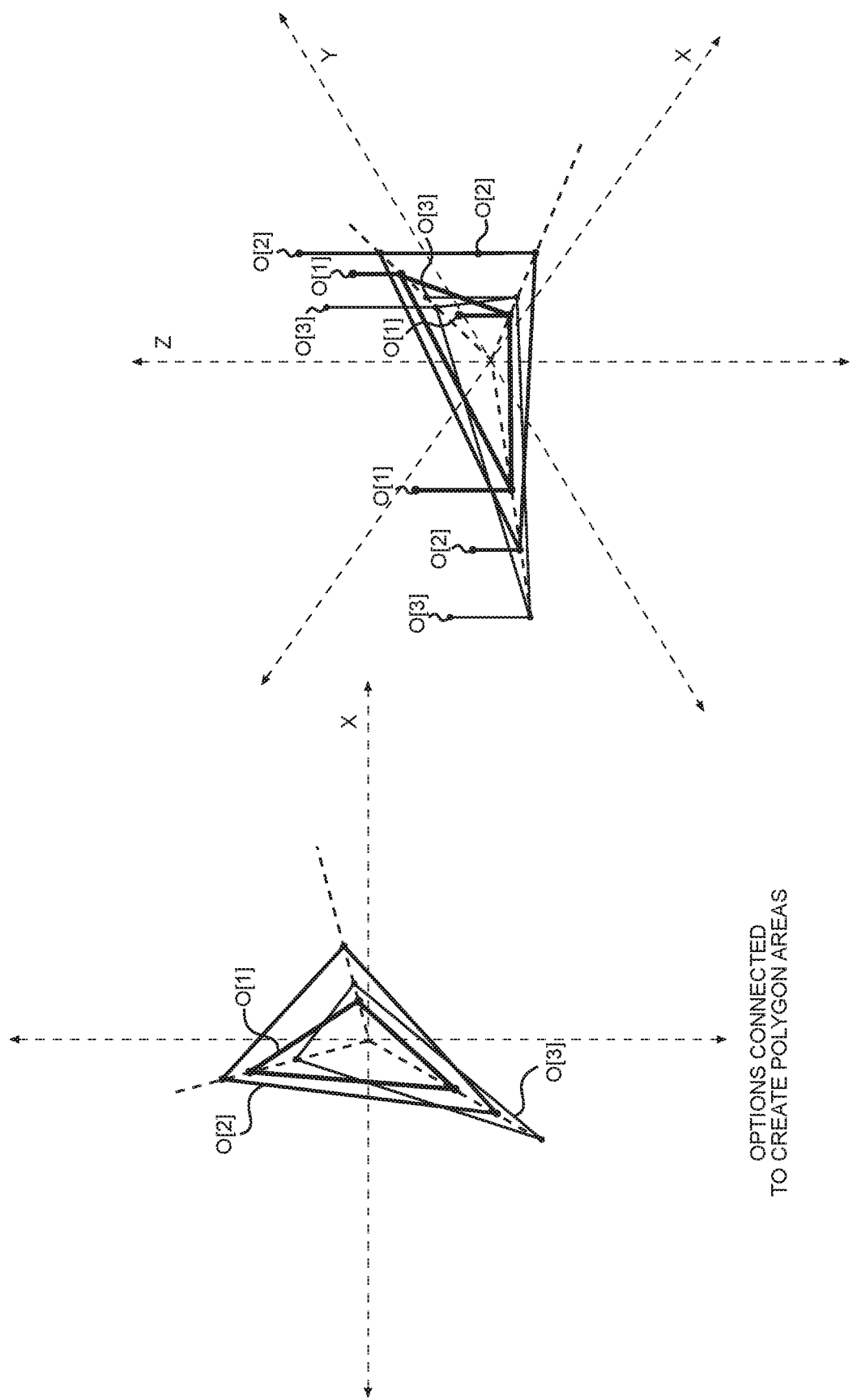

AUTOMATED BUILDING DESIGN GUIDANCE SOFTWARE THAT OPTIMIZES COST, ENERGY, DAYLIGHT, GLARE, AND THERMAL COMFORT

BACKGROUND OF THE INVENTION

The present invention relates to computer implemented structural and architectural building design and, more particularly, to an automated building design guidance software that optimizes cost, energy, daylight, glare, and thermal comfort.

The complexity of making decisions about building performance increases with each passing year while the cost to comply with energy efficiency standards is rising. Architects, engineers, contractors, and building owners need guidance without having to hire expensive consultants. Most design choices are made based on what worked well on the last project or what the team is already familiar with. Even when building science techniques are applied to find efficiencies, the process requires several different tools and hours of spreadsheet manipulation. The problem becomes even greater when trying to compare performance criteria such as daylight, glare, and thermal comfort as these kinds of analysis must be run separately and there currently no mathematical way of balancing these competing objectives that is not computationally intensive.

Computer implemented building performance simulations currently can only be run by specialized technicians with years of training as such simulations are overly reliant on user input and user interpretation of graphs and performance curves thus limiting their usefulness to the broader practices of architecture, engineering, and construction management. In short, current software tools for automated building design do not analyze designs for multiple building performance and cost optimization metrics, do not check the data being entered for quality, and produce output that still must be interpreted by a specialist.

As can be seen, there is a need for a system for automated building design guidance software that optimizes cost, energy, daylight, glare, thermal comfort, and other performance metrics. The system embodies a computer implemented method configured to run simulations 100 times faster while maintaining accuracy through automating the setup of the simulation, checking inputs to reduce human error, and most importantly is configured to use a geometric balancing algorithm that interprets the results for the user. As a result, the software produces meaningful conclusions with minimal human input through, in part, the utilization of databases prepared by experienced building performance consultants and the inventive geometric balancing algorithm's analysis of such databases by, among other things, machine learning to allow the software to quickly automate the inputs.

The analysis and evaluation include a multi-objective optimization to minimize cost while hitting building performance targets using a geometric framework. The results of the optimization are intelligently examined by the software to produce recommendations in automated reports. Using this geometric methodology for running the optimizations allows many competing objectives to be analyzed in a fraction of the time accurately. The resulting reduction of complexity gives architects, engineers, contractors, and owners the ability to make the best decision in real time without the need or expense of specialized consultants.

SUMMARY OF THE INVENTION

In one aspect of the present invention, a method of optimizing a combination of building components in computer-implemented building design, includes the following: defining one or more options for each building component; providing an energy use intensity versus cost optimization value for each option for a plurality of metrics; selecting a subset of the plurality of metrics applicable to each option; defining a metric vector for each metric through connecting the energy use intensity versus cost optimization value for each option; arranging each metric vector on a coordinate grid with an equal angle between each metric vector; constructing a two-dimensional polygon on an XY-plane by interconnecting for all the metric vectors the energy use intensity versus cost optimization value for each option; providing a performance value for each option for each metric vector based on a percentage the metric vector the associated option represents; and representing a fitness factor for each option as a function of each of the plurality of metrics.

These and other features, aspects and advantages of the present invention will become better understood with reference to the following drawings, description and claims.

BRIEF DESCRIPTION OF THE DRAWINGS

FIG. 2 is a graphical view of an exemplary embodiment of the present invention, illustrating performance rating of lines as a function of energy cost;

FIG. 3 is a graphical view of an exemplary embodiment of the present invention, illustrating performance metrics spaced on a second coordinate system;

FIG. 4 is a graphical view of an exemplary embodiment of the present invention, illustrating options relating to polygon areas;

FIG. 5 is a graphical view of an exemplary embodiment of the present invention, illustrating vertical lines relating to performance values between 0 and 100 percent.

DETAILED DESCRIPTION OF THE INVENTION

The following detailed description is of the best currently contemplated modes of carrying out exemplary embodiments of the invention. The description is not to be taken in a limiting sense, but is made merely for the purpose of illustrating the general principles of the invention, since the scope of the invention is best defined by the appended claims.

Referring to FIGS. 1 through 6, the present invention may include at least one computer with a user interface. Each computer may couple at least one processing unit to a form of memory and may include, but not be limited to, a microprocessor, a server, a desktop, laptop, and smart device, such as, a tablet and smart phone. Each computer includes a program product including a machine-readable program code for causing, when executed, the computer to perform steps. The program product may include software which may either be loaded onto the computer or accessed by the computer. The loaded software may include an application on a smart device. The software may be accessed by each computer using a web browser. Each computer may access the software via the web browser using the internet, extranet, intranet, host server, internet cloud and the like.

Figure 1:
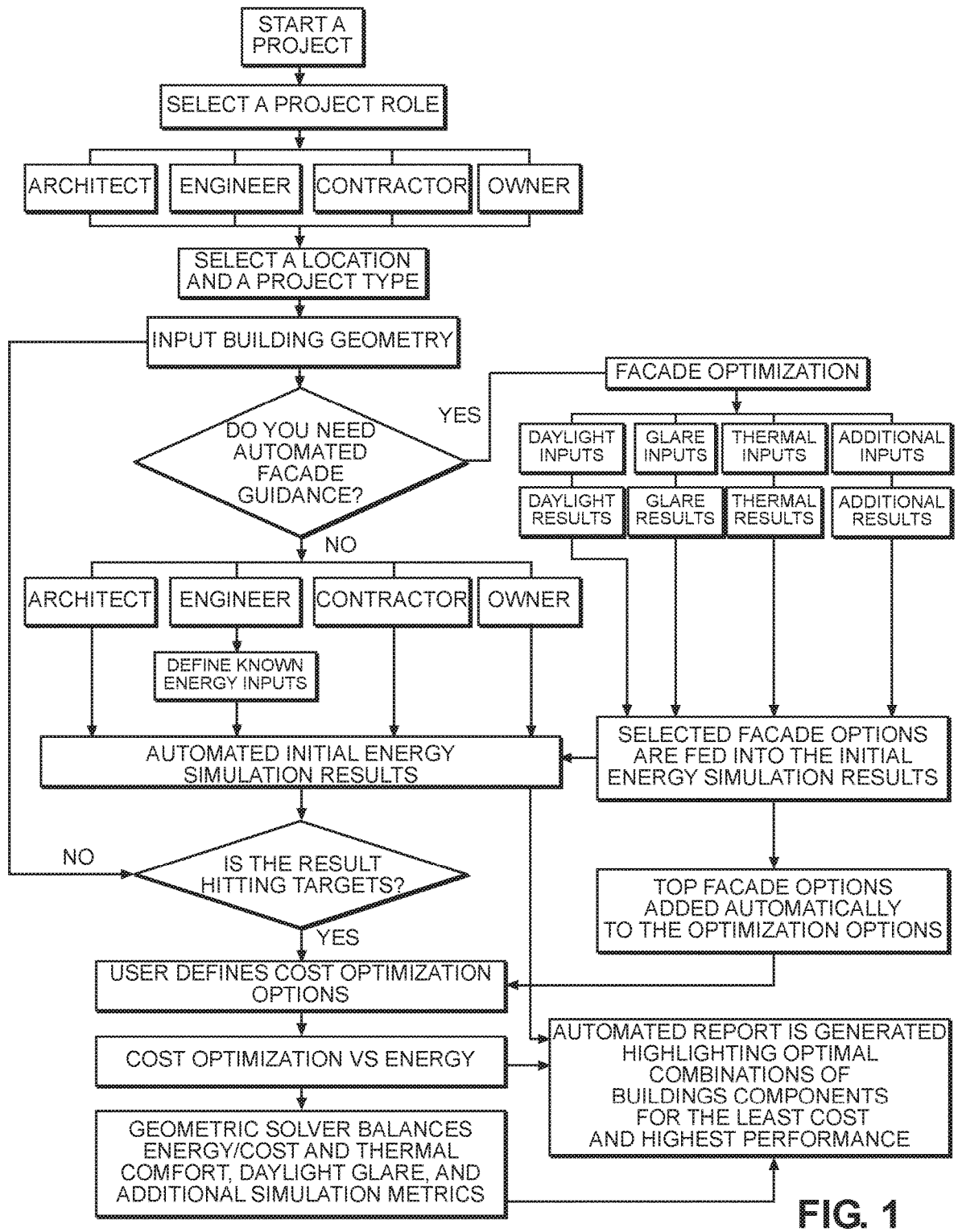
FIG. 1 is a flow chart of an exemplary embodiment of the present invention.
Figure 6:
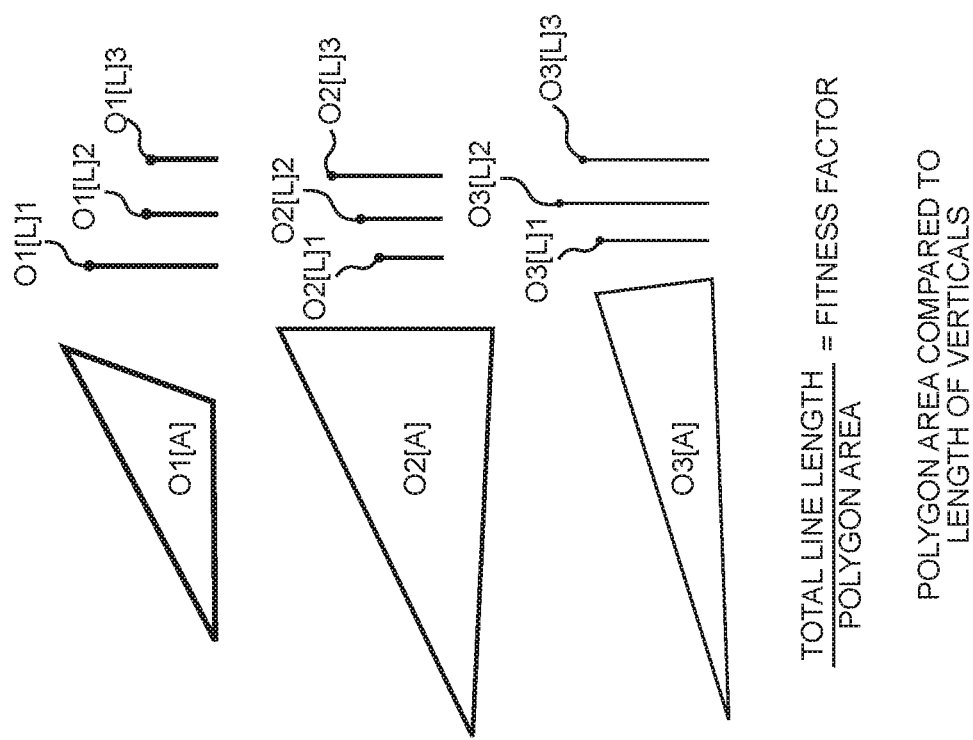
FIG. 6 is a graphical view of an exemplary embodiment of the present invention, illustrating determination of fitness factor as a function of polygon area and lengths of vertical lines.

Referring to FIG. 1, the process embodied in the present invention includes may include the following. First, a user may start a project, and then select a level of expertise, for example Architect, Engineer, Contractor, or Building Owner. The user may define a project type and location through, among other things, importing relevant building geometry, defining known energy inputs, inputting daylight/glare optimization data, inputting thermal comfort optimization, and inputting cost optimization data. The system embodied by the present invention is configured to automate the energy simulation results, the daylight/glare optimization results, and the thermal comfort optimization results, as well as generate cost optimization vs energy comparative result, highlighting optimal combinations of buildings components for the least cost and highest performance.

Critically, the present invention may include a geometric solver that balances energy/cost and thermal comfort, daylight, and glare metrics, wherein the geometric solver is configured to balance daylight, glare, and thermal comfort against energy, cost, and other performance metrics. The first step is to run an energy use intensity or EUI versus cost optimization using an algorithm or machine learning routine to find local maximum combinations that satisfy the highest energy performance for least cost combinations of building components. Since options are discrete and not continuous, it is possible to run several hundred simulations to determine, with a high degree of confidence, that the most optimal combinations of cost and energy have been run.

Next, each metric is laid out on a vector that represents the energy use intensity for each option of that metric vs the cost. An example would be a bundle of options that included a building façade with 12", 18", or 24" fins. The measured energy use intensity (EUI) of each option (measured in either SI or Imperial Units) divided by the cost is used to set the location of that option on the vector. There should be at least three competing metrics (i.e. daylight, glare, thermal comfort, indoor air quality, etc.) since two metrics would work well with any other two-objective algorithm. Each vector is then arranged on a coordinate grid with an equal angle between each vector. A line between each option on each vector is drawn moving counterclockwise to construct a 2D polygon on the xy-plane. Metrics for buildings are measured in terms of percentage (i.e. 0 to 100% daylight autonomy). Vertical z-vectors for each option in each vector are drawn representing how well that option scores. A second optimization is then run for this discrete data set trying to find the greatest total vertical line length vs the area of the 2d polygons using an algorithm or machine learning routine. A holistic cost vs performance optimization fitness factor is found allowing the user to accurately and quickly determine the highest performance vs cost of each bundle of building components. An unlimited number of metric vectors can be evaluated using this methodology with broad applications far beyond building science to wherever competing objects must be evaluated quickly.

In short, once geometry, location, and project type are defined the tool can run simulations. Additional options are refined in the energy, daylight/glare, and thermal comfort input steps. Next, costs are assigned to previously defined options and a cost vs building performance is run to find the highest performing building for the least cost. Then the geometric solver optimization is run to balance daylight, glare, and thermal comfort against energy and cost. Finally, an automated report is generated with conclusions and recommendations.

A method of configuring the present invention may include coding several individual simulation engines to be run together including energy, daylight, glare, and thermal comfort simulation engines. Next, databases of energy codes must be created to automate inputs to the simulation engines. Input databases for daylight, glare, and thermal comfort may be created manually or via machine learning. On top of the simulation engines and databases, a graphically clear, step-by-step web interface is built allowing the user to interact with the tool. Also coupled to the system may be a cost versus building performance optimization algorithm built to search the entire range of available solutions to the options defined in the detailed steps. A filter code may be made to sort through the results to create meaningful conclusions. Finally, an automated report generator must be added to the code to allow users to share the conclusions.

In order for a user to make a comprehensive decision a multi-objective optimization must be run to balance energy and cost versus building performance. To work even better, faster algorithms, predictive analysis using machine learning, and additional performance metrics such as air quality or water usage could be added.

A method of using the present invention includes the following. The system above may be provided. A building designer opens the tool, uploads geometry, and answers questions about their building. They run the simulations and look through the automated report to see where their current design stands. Based on feedback from the geometric solver, the user may modify their design and retest until their design meets their objectives for performance. Instead of waiting until late in the process to have a specialist provide analysis that is too late to make an impact, they know immediately what the best decision is. The tool produces an automated recommendations report that allows the user to make meaningful decisions on their building project to increase the performance while saving on the cost of construction and the operating cost of the building.

The geometric solver method could be used in other fields to balance competing objectives for optimization problems. This method is unique in that it requires much less computational time and it easier to visualize the relationship between variables.

The computer-based data processing system and method described above is for purposes of example only, and may be implemented in any type of computer system or programming or processing environment, or in a computer program, alone or in conjunction with hardware. The present invention may also be implemented in software stored on a computer-readable medium and executed as a computer program on a general purpose or special purpose computer. For clarity, only those aspects of the system germane to the invention are described, and product details well known in the art are omitted. For the same reason, the computer hardware is not described in further detail. It should thus be understood that the invention is not limited to any specific computer language, program, or computer. It is further contemplated that the present invention may be run on a stand-alone computer system, or may be run from a server computer system that can be accessed by a plurality of client computer systems interconnected over an intranet network, or that is accessible to clients over the Internet. In addition, many embodiments of the present invention have application to a wide range of industries. To the extent the present application discloses a system, the method implemented by that system, as well as software stored on a computer-readable medium and executed as a computer program to perform the method on a general purpose or special purpose computer, are within the scope of the present invention. Further, to the extent the present application discloses a method, a system of apparatuses configured to implement the method are within the scope of the present invention.

It should be understood, of course, that the foregoing relates to exemplary embodiments of the invention and that modifications may be made without departing from the spirit and scope of the invention as set forth in the following claims.

What is claimed is:

1. A method of optimizing a combination of building components in computer-implemented building design, comprising:
    defining one or more options for each building component;
    providing an energy use intensity versus cost optimization value for each option for a plurality of metrics;
    selecting a subset of the plurality of metrics applicable to each option;
    defining a metric vector for each metric through connecting the energy use intensity versus cost optimization value for each option;
    arranging each metric vector on a coordinate grid with an equal angle between each metric vector;
    constructing a two-dimensional polygon for each option on an XY-plane by interconnecting for all the metric vectors the energy use intensity versus cost optimization value for each option;
    providing a performance value for each option of each metric vector based on a percentage the metric vector represented by at least one of each option; and
    representing a fitness factor for each option as a function of each of the plurality of metrics.

2. The method of claim 1, further comprising determine a highest fitness of each combination of building components.

3. The method of claim 1, wherein the plurality of metrics comprise at least three competing metrics.

4. The method of claim 3, wherein the at least three competing metrics are related to thermal comfort, daylight, and glare respectively.

5. The method of claim 1, wherein one of the building components comprise building façade.

6. The method of claim 1, wherein each fitness factor for each option is defined as a performance score for said option divided by the two-dimensional polygon for said option.

* * * * *